US009262307B2

(12) United States Patent
Segall et al.

(10) Patent No.: US 9,262,307 B2
(45) Date of Patent: Feb. 16, 2016

(54) MODELING TEST SPACE FOR SYSTEM BEHAVIOR WITH OPTIONAL VARIABLE COMBINATIONS

(75) Inventors: Itai Segall, Tel-Aviv (IL); Rachel Tzoref-Brill, Haifa (IL); Aviad Zlotnick, Mitzpeh Netofah (IL)

(73) Assignee: International Business Machines Corporation, Armonk, NY (US)

( * ) Notice: Subject to any disclaimer, the term of this patent is extended or adjusted under 35 U.S.C. 154(b) by 817 days.

(21) Appl. No.: 13/253,089

(22) Filed: Oct. 5, 2011

(65) Prior Publication Data

US 2013/0091382 A1 Apr. 11, 2013

(51) Int. Cl.
*G06F 11/36* (2006.01)
*G01R 31/3183* (2006.01)
*G01R 31/3181* (2006.01)

(52) U.S. Cl.
CPC ........ *G06F 11/3676* (2013.01); *G06F 11/3684* (2013.01); *G01R 31/3181* (2013.01); *G01R 31/3183* (2013.01); *G01R 31/31813* (2013.01); *G01R 31/31835* (2013.01); *G01R 31/318314* (2013.01); *G01R 31/318357* (2013.01); *G01R 31/318364* (2013.01)

(58) Field of Classification Search
CPC ..... G06F 17/50; G06F 17/5009; G06F 11/36; G06F 11/3672; G06F 11/3668; G06F 11/3676; G06F 11/3684; G01R 31/3181
USPC ............ 703/2, 13, 14, 22; 714/32, 33, 37, 46; 717/104
See application file for complete search history.

(56) References Cited

U.S. PATENT DOCUMENTS

| 6,577,982 B1* | 6/2003 | Erb ..................... G06F 11/3684 702/120 |
| 6,779,135 B1 | 8/2004 | Ur et al. |
| 7,024,589 B2 | 4/2006 | Hartman et al. |
| 7,395,196 B2 | 7/2008 | Emek |
| 8,386,851 B2* | 2/2013 | Ur .................................. 714/32 |
| 8,397,104 B2* | 3/2013 | Ur ....................... G06F 11/3676 714/25 |
| 8,954,310 B2* | 2/2015 | Farchi .............. G01R 31/31835 703/21 |
| 8,990,626 B2* | 3/2015 | Farchi ................. G06F 11/3684 714/33 |
| 2003/0046613 A1 | 3/2003 | Farchi et al. |

(Continued)

OTHER PUBLICATIONS

Leung et al., "Deriving test cases using class vectors", Software Engineering Conference, 2000. APSEC 2000. Proceedings. Seventh Asia-Pacific Digital Object Identifier: 10.1109/APSEC.2000.896693 Publication Year: 2000, Abstract Only, 1 page.

(Continued)

*Primary Examiner* — Kibrom K Gerbresilassie
(74) *Attorney, Agent, or Firm* — Patricia B. Feighan

(57) ABSTRACT

A method executable on one or more processors for modeling a test space is provided. The method may include defining a coverage model including a set of variables. The method may also include selecting one or more variables within at least one subset of a plurality of subsets of the set of variables. The selection may be according to an interaction level requirement defined for at least one or more of the subsets, whereby the interaction level corresponds to a coverage of the test space that covers a plurality of possible combinations of the one or more variables at multiple levels. Furthermore, respective values for the one or more selected variables within the subset of the set of variables may be assigned. The method may also include one or more definitions for value combinations for said variables with assigned values.

25 Claims, 9 Drawing Sheets

(56) References Cited

U.S. PATENT DOCUMENTS

| | | |
|---|---|---|
| 2003/0121025 A1 | 6/2003 | Farchi et al. |
| 2004/0216023 A1* | 10/2004 | Maoz et al. ............... 714/742 |
| 2004/0260516 A1* | 12/2004 | Czerwonka ............... 702/186 |
| 2005/0166103 A1* | 7/2005 | Gupta et al. ............... 714/718 |
| 2005/0234688 A1* | 10/2005 | Pinto et al. ............... 703/6 |
| 2006/0229860 A1* | 10/2006 | Azatchi et al. ............... 703/14 |
| 2007/0168727 A1* | 7/2007 | Fournier .......... G01R 31/31834 714/25 |
| 2007/0226161 A1* | 9/2007 | Factor .................... G06N 5/025 706/47 |
| 2008/0255822 A1* | 10/2008 | Adir ......................... G06F 8/30 703/21 |
| 2008/0256393 A1* | 10/2008 | Ur .................................. 714/38 |
| 2009/0254332 A1 | 10/2009 | Azatchi et al. |
| 2010/0274520 A1* | 10/2010 | Ur ...................... G06F 11/3676 702/123 |
| 2010/0275062 A1 | 10/2010 | Ur |
| 2010/0287534 A1* | 11/2010 | Vangala ............. G06F 11/3612 717/124 |
| 2011/0004867 A1 | 1/2011 | Holden et al. |
| 2011/0289488 A1* | 11/2011 | Ghosh .......................... 717/131 |
| 2012/0102365 A1* | 4/2012 | Adler ................. G06F 11/3676 714/45 |
| 2012/0102366 A1* | 4/2012 | Adler ................. G06F 11/3676 714/45 |
| 2012/0324286 A1* | 12/2012 | Birnbaum ........... G06F 11/3608 714/26 |
| 2013/0085741 A1* | 4/2013 | Segall ................. G06F 11/3676 703/21 |
| 2013/0103983 A1* | 4/2013 | Tzoref-Brill ........ G06F 11/3676 714/26 |
| 2015/0254167 A1* | 9/2015 | Farchi ................ G06F 11/3684 717/124 |

OTHER PUBLICATIONS

Younis et al., "Generating pairwise combinatorial test set using artificial parameters and values", International Symposium on Information Technology, Aug. 2008. Abstract Only, 1 page.

Brand, D. "Exhaustive simulation need not require an exponential Number of tests", IEEE Transactions on Computer-Aided Design of Integrated Circuits and Systems, Nov. 1993, Volume: 12 Issue: 11, URL: http://dx.doi.org/10.1109/43.248074 Abstract Only, 1 page.

Kimoto et al., "Pairwise Testing in the Presence of Configuration Change Cost", SSIRI '08. Second International Conference on Secure System Integration and Reliability Improvement, Jul. 2008, pp. 32-38.

\* cited by examiner

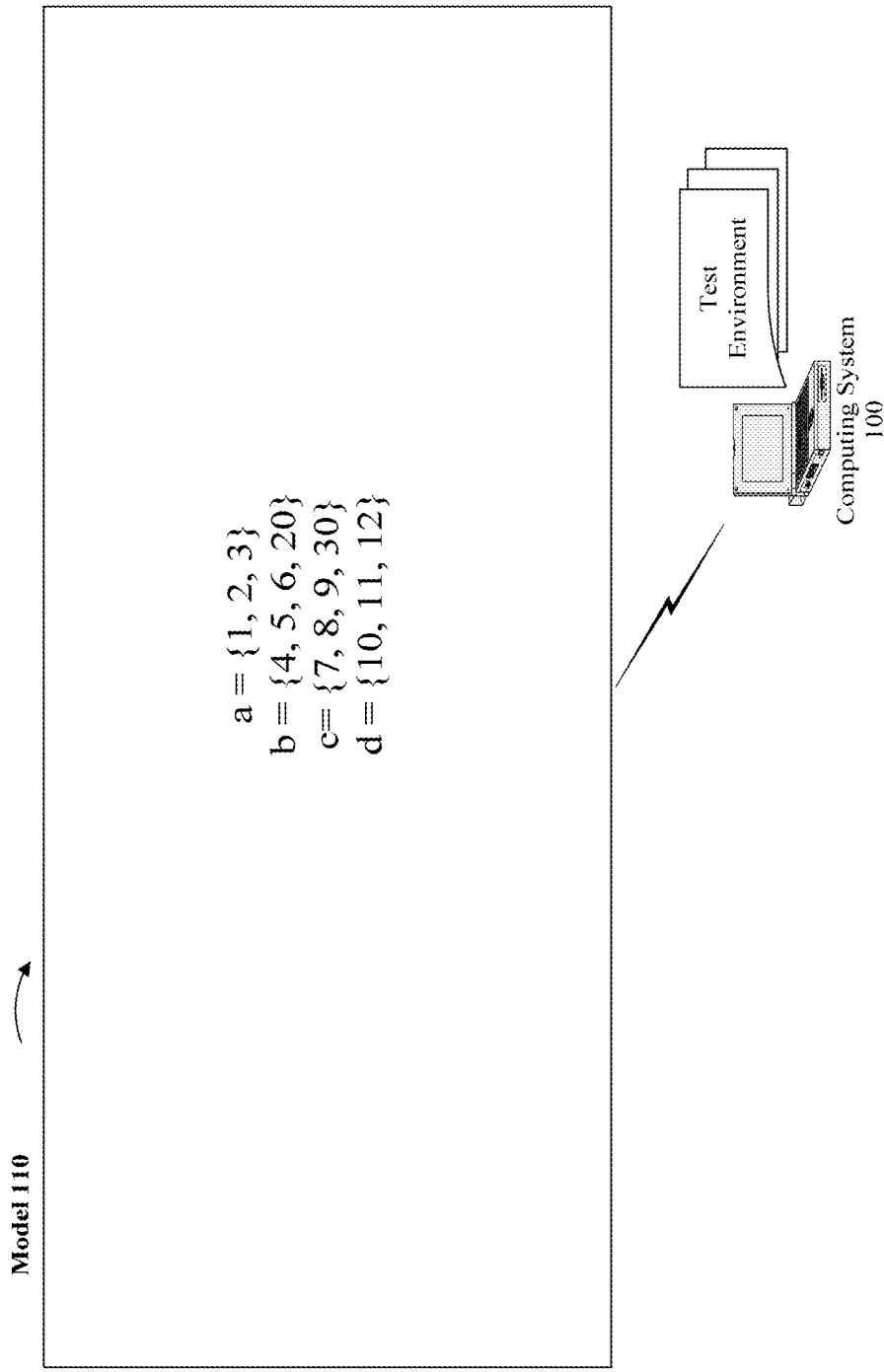

Displaying CTD solution: 16 tasks

| a | b | c | d |
|---|---|---|---|
| 2 | 4 | 7 | 11 |
| 3 | 4 | 8 | 12 |
| 3 | 5 | 7 | 10 |
| 2 | 5 | 9 | 12 |
| 1 | 4 | 9 | 10 |
| 3 | 6 | 9 | 11 |
| 2 | 20 | 8 | 10 |
| 1 | 5 | 8 | 11 |
| 1 | 20 | 7 | 12 |
| 1 | 6 | 20 | 12 |
| 3 | 20 | 20 | 11 |
| 2 | 4 | 20 | 10 |
| 2 | 6 | 7 | 10 |
| 1 | 6 | 8 | 11 |
| 3 | 5 | 20 | 11 |
| 1 | 20 | 9 | 12 |

Export | Test Generation | Generate Another Solution

FIG. 1B

| Displaying CTD solution: 15 tasks | | | |
|---|---|---|---|
| a | b | c | d |
| 2 | 4 | 7 | 11 |
| 3 | 4 | 8 | 12 |
| 3 | 5 | 7 | 10 |
| 2 | 5 | 9 | 12 |
| 1 | 4 | 9 | 10 |
| 3 | 6 | 9 | 11 |
| 2 | 20 | 8 | 10 |
| 1 | 5 | 8 | 11 |
| 1 | 6 | 30 | 12 |
| 1 | 20 | 7 | 12 |
| 2 | 4 | 30 | 10 |
| 2 | 6 | 8 | 10 |
| 3 | 20 | 9 | 11 |
| 3 | 5 | 30 | 11 |
| 2 | 6 | 7 | 10 |

Export | Test Generation | Generate Another Solution

FIG. 1C

| Displaying CTD solution: 12 tasks | | | |
|---|---|---|---|
| a | b | c | d |
| 3 | 4 | 9 | 10 |
| 2 | 20 | 7 | 11 |
| 2 | 4 | 9 | 12 |
| 3 | 5 | 7 | 12 |
| 1 | 5 | 8 | 12 |
| 1 | 4 | 9 | 11 |
| 1 | 20 | 30 | 10 |
| 2 | 6 | 7 | 10 |
| 3 | 6 | 8 | 11 |
| 2 | 5 | 30 | 12 |
| 3 | 20 | 8 | 10 |
| 1 | 6 | 30 | 11 |

[Export] [Test Generation] [Generate Another Solution]

FIG. 1D

| a | b | c | d |
|---|---|---|---|
| 3 | 4 | 9 | 10 |
| 2 | 20 | 7 | 11 |
| 2 | 4 | 9 | 12 |
| 3 | 5 | 7 | 12 |
| 1 | 5 | 8 | 12 |
| 1 | 4 | 9 | 11 |
| 1 | 20 | 8 | 10 |
| 2 | 5 | 7 | 10 |
| 3 | 5 | 8 | 11 |
| 1 | 5 | 30 | 12 |
| 2 | 5 | 30 | 11 |
| 3 | 20 | 8 | 12 |
| 1 | 5 | 30 | 10 |

Displaying CTD solution: 12 tasks

Export | Test Generation | Generate Another Solution

FIG. 1E

MODELING TEST SPACE FOR SYSTEM BEHAVIOR WITH OPTIONAL VARIABLE COMBINATIONS

COPYRIGHT & TRADEMARK NOTICES

A portion of the disclosure of this document may contain material subject to copyright protection. Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

TECHNICAL FIELD

The disclosed subject matter relates generally to modeling test space for system behavior.

BACKGROUND

Model based techniques may be used for generating tests for verifying the behavior of a computing system. A model includes a set of attributes in addition to values for the attributes and corresponding restrictions on said values or value combinations. The set of valid value combinations defines the space to be tested. In a Cartesian-product based model, the test space is defined as all possible combinations of variable values that are not ruled out by restrictions.

The size of a Cartesian-product based model is the product of the number of values for each attribute (i.e., $A_1 * A_2 * \ldots * A_n$), where $A_n$ represents the number of valid values for the $n^{th}$ attribute. One would appreciate that the size of the model can become prohibitively large, depending on the number of attributes, the possible number of values assigned to each attribute and the restrictions.

SUMMARY

For purposes of summarizing, certain aspects, advantages, and novel features have been described herein. It is to be understood that not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

In accordance with one embodiment, a method for modeling test space for verifying system behavior is provided. The method comprises defining a coverage model including: one or more variables, wherein respective values for the variables are assigned, and one or more definitions for value combinations for said variables with assigned values, wherein at least one of said value combinations is defined as optional, and zero or more other said value combinations are defined as forbidden or mandatory for purpose of generating test scenarios to test a system for which the coverage model is defined.

In accordance with one or more embodiments, a system comprising one or more logic units is provided. The one or more logic units are configured to perform the functions and operations associated with the above-disclosed methods. In yet another embodiment, a computer program product comprising a computer readable storage medium having a computer readable program is provided. The computer readable program when executed on a computer causes the computer to perform the functions and operations associated with the above-disclosed methods.

One or more of the above-disclosed embodiments in addition to certain alternatives are provided in further detail below with reference to the attached figures. The disclosed subject matter is not, however, limited to any particular embodiment disclosed.

BRIEF DESCRIPTION OF THE DRAWINGS

The disclosed embodiments may be better understood by referring to the figures in the attached drawings, as provided below.

FIG. 1A illustrates an exemplary computing environment in accordance with one or more embodiments, wherein a test model is implemented for verifying a computing system.

FIGS. 1B through 1E are exemplary illustrations of a graphical user interface for displaying a set of tests, in accordance with one embodiment, where a test is represented by assigning a value to one or more variables defined by the test model.

Features, elements, and aspects that are referenced by the same numerals in different figures represent the same, equivalent, or similar features, elements, or aspects, in accordance with one or more embodiments.

DETAILED DESCRIPTION OF EXAMPLE EMBODIMENTS

Figure 1F:
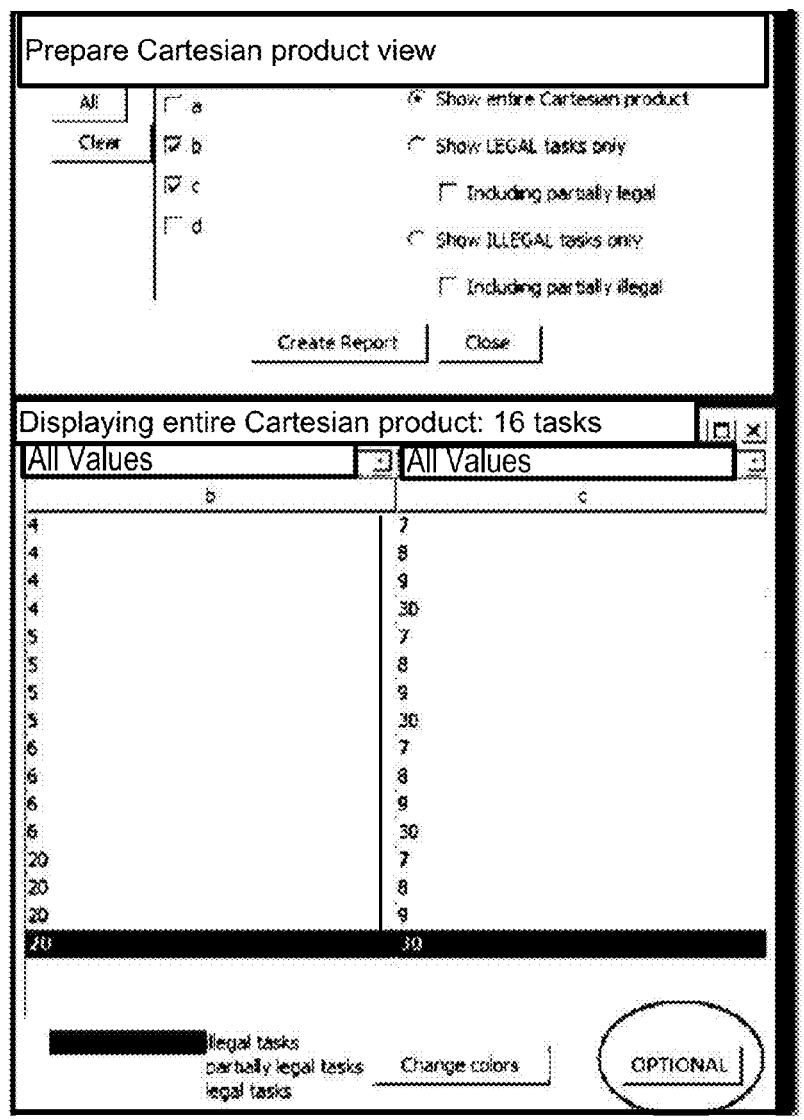
FIG. 1F is a graphical user interface for allowing a user to select certain value combinations for variables in the test model as optional, in accordance with one embodiment.

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

In accordance with one or more embodiments, a coverage model is used to test a target system. The model defines variables (i.e., attributes), possible values for the variables, and conditions or restrictions indicating when values for one or more variables or value combinations for a plurality of variables are valid or invalid. The set of valid value combinations and requirements for combinations of variables that are to be included in the test plan defines the coverage model. The test space may be defined by the product (e.g., the Cartesian product) of variable values, taking into account the dictated conditions or restrictions. The size of the test space is approximately proportional to the product of the number of values that can be assigned to each variable.

The size of the test space defined by a Cartesian product may be too big to be covered. As such, in one embodiment, subsets of the variables whose combinations are to be covered may be defined. For example, when the Cartesian product of every two variables is covered, the resulting test plan is smaller than the full Cartesian product, yet the ability to detect bugs may be slightly less successful than the full product. The subsets of the variables whose combinations are covered are referred to as the required interactions, or interaction requirements.

As such, in one embodiment, a test suite is provided based on (1) a set of variables and the possible variable values, (2) conditions that define restrictions on said values or combinations of values that may be assigned to those variables, and (3) a set of defined conditions for combinations of variables that are to be included in the test suite. The test suite is thus implemented to test the test space defined by a coverage model according to a test plan. As provided in further detail below, a combinatorial algorithm may be applied to select the test suite out of the test space according to the coverage model, so that a smaller number of tests are performed.

In one implementation, certain legal value combinations may be marked as optional in the coverage model, and thus may either appear in the test suite or not. The removed value combinations are not illegal in light of the set of defined conditions or restrictions that apply to the combination of values in the test suite, and nor are they required to appear in the test suite. In this context, there is a distinction between the combinations of variables and the combinations of values. The former defines the target variable combinations (e.g., the interesting variables). The latter indicates that some values of these variable combinations are either mandatory (i.e., necessary), forbidden (i.e., not allowed) or optional (i.e., allowed but not necessary).

Thus, in accordance with one embodiment, the conditions (i.e., restrictions on values of the variables or variable combinations) are provided to include a choice for defining variable values or combinations of values as "optional" as well as defining some as "mandatory" or "forbidden". For example, mandatory conditions or restrictions may be defined by a list of logical Boolean operations or indicators (e.g., binary flags) . Similarly, a list of logical Boolean operations may be used to define the optional combinations in an exemplary embodiment. Depending on implementation, same or similar logical language may be used to define the optional combinations of values as the one used to define the mandatory restrictions.

As provided in further detail below, a graphical user interface may be implemented that provides the restrictions on combinations on a visual platform to allow a user to designate certain combinations as optional and others as forbidden. Further, for the purpose of clarification, an example applying the methods discussed above is provided below. It is noteworthy, however, that the provided example below is based on one of many possible implementations and embodiments. Moreover, the details disclosed in this example are not to be used to construe the scope of the claimed subject matter narrowly as limited to said details or features.

Referring to FIG. 1A, for example, a model 110 may be constructed over computing system 100 to test the functionality of a system under test. A plurality of sets may be defined where members of the sets represent test values for variables represented by that set. In an example scenario involving four variables, the following presentation of possible values may be provided for variables a, b, c and d:

a={1, 2, 3}
b={4, 5, 6, 20}
c={7, 8, 9, 30}
d={10, 11, 12}

Referring to FIGS. 1A through 1F, a value table may be generated such that any pair of values appears at least once (i.e., pair-wise interaction) as shown in FIGS. 1A to 1E. A value table is a representation of a test suite, where one or more lines in the table define the values assigned to variables in a test scenario. According to one embodiment, the range of pairs may be reduced by defining optional pairs (i.e., pairs that are not necessary but are allowed) in addition to the values that are not allowed. Note that if it is determined that including an optional pair may narrow down the test space, then that pair may be included in the test space.

Referring again to FIG. 1A, exhaustive testing of the model defined by the four variables a, b, c and d may involve 144 possible test cases as defined by the Cartesian-product of the model, for example. Referring to FIG. 1B, a test suite that requires covering every pair of values may need 16 tests, based on the results generated from a combinatorial algorithm, and as illustrated in the exemplary table.

Referring to FIG. 1C, if the pair (20,30) for variable tuple (b,c) is not to be covered (i.e., marked "optional" or "forbidden"), for example, then 15 tests remain. Referring to FIG. 1D, if the requirement is to cover only tuples (a,b), (a,d), and (c,d) and not (b,c), then 12 tests are needed. Referring to FIG. 1E, if the pair (20,30) is not allowed (i.e., marked "forbidden") then 13 tests are needed. This example shows the advantage of using "optional" combinations over using "forbidden" ones. This is a valid option only if the combination can be included in a test.

Referring to FIG. 1F, an exemplary user interface is provided by which a user may define variable values that are to be treated as optional. In the illustrated example in FIG. 1F, the variables a, b, c, d are depicted with selection means (e.g., check boxes) appearing next to each of the variables. If a user wants to indicate that certain values for the variables b and c are optional, the user checks the corresponding boxes. The result will provide a list of the pairs of values for the tuple (b,c).

From the above list of pairs, the user may select a target pair (e.g., the pair corresponding to values 20 and 30, respectively) to be marked as excluded or optional, by way of selecting a button, for example. The optional variable values may be treated in the model such that the values of the optional variables are not necessarily included in any output scenario, while at the same time such optional values are not designated as illegal according to the defined restrictions for the variables in the model.

Figure 2:
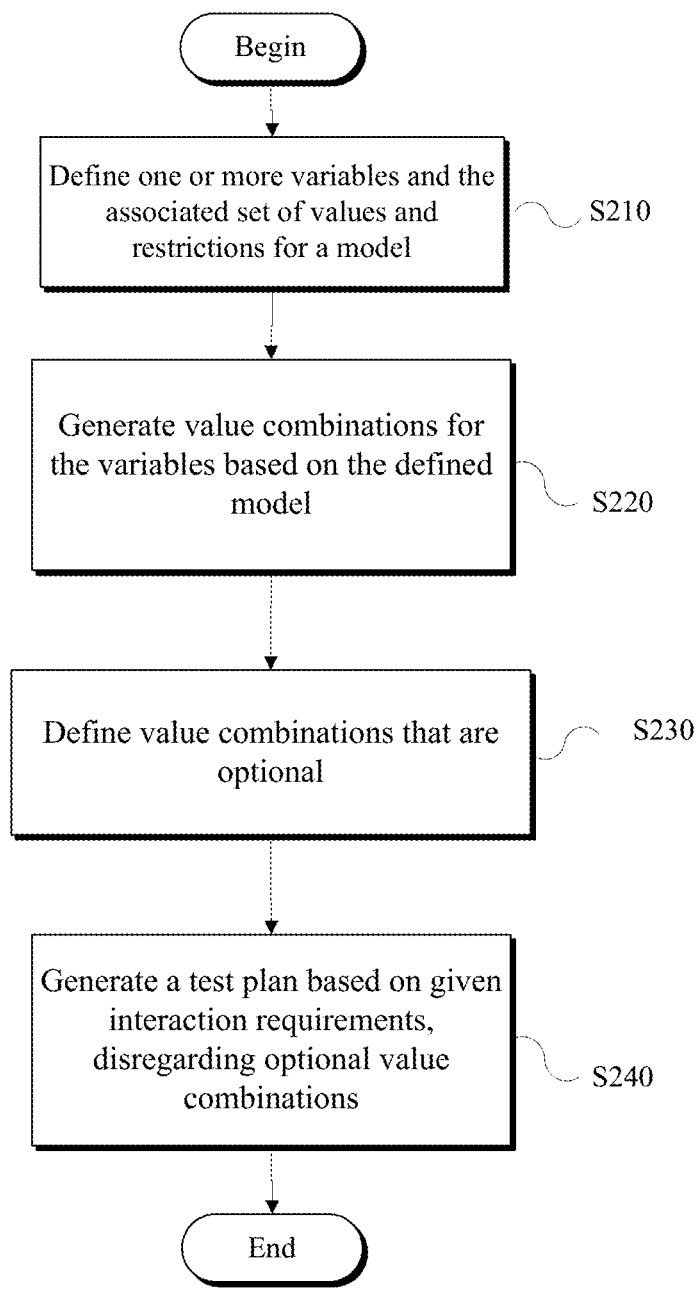
FIG. 2 is a flow diagram of an exemplary method for modeling a test space for a system, using optional variable combinations, in accordance with one embodiment.

Referring to FIG. 2, and to summarize the above mentioned schemes, in one embodiment, one or more variables and associated set of values and restrictions for a model may be defined (S210). The variables and associated set of values may be provided in the form of sets of values that can be assigned to one or more variables (e.g., a={1, 2, 3}; b={4, 5, 6, 20}; c={7, 8, 9, 30}; etc.). Using a modeling tool, the possible value combinations for one or more variables are generated based on the defined model (S220). For example, the legal values assignable to variables that are of interests (e.g., variables b and c) may be generated in form of couples (e.g., (20,7), (20, 8), (20, 9) and (20, 30)). The value combinations for the variables or values of interest may be generated based on a Cartesian product based model, for example.

One or more value combinations from the generated set of value combinations may be defined as optional (e.g., defined as not mandatory even if the assigned values are legal) (S230). A test plan for the system is then generated from the model, based on given interaction requirements, while disregarding value combinations that are designated as optional (S240). A combinatorial algorithm may be used to generate a relatively small set of tests (or test scenarios) that satisfy the interaction requirements.

For example, the restrictions for the combination of variable values, in addition to the optional value combinations may be provided as input to a combinatorial test design (CTD) engine. Given a Cartesian-product model with n variables, a combinatorial algorithm may be used to find a subset of valid variable value combinations in the test space that covers possible combinations of every m variables, wherein m defines a certain interaction level.

The interaction level, depending on implementation, refers to the coverage of the selected subset of the test space, wherein the test space covers the possible combinations of m number of variables in the set defined by the respective coverage model—m is less than or equal to the total number of variables n in the model. As an example, interaction level two (also referred to as a pair-wise interaction) means that, for every two variables, all or some valid value combinations appear in the selected subset of the test space. The motivation for this approach is that empiric evidence show that most bugs depend on the interaction between a small number of variables. In general, testing such interactions leads to detecting a majority of bugs in a system.

Depending on implementation, the interaction level requirements may be defined at multiple levels with mixed-strength. For example, interaction level m may be defined for one subset of variables, and interaction level k for another subset of variables. In one embodiment, the two subsets of variables are not disjoint but may include mutually inclusive members depending on the test coverage goals and limitations. This will allow a test developer with flexibility in defining a test space that covers certain variables or values with more particularity.

In one embodiment, the combinatorial algorithm utilized to provide an m-way combination of values may be iterative in nature. In an iteration, the algorithm may find a valid set of values for the target variables such that the found set contributes the most to the remaining uncovered combinations. After applying the combinatorial algorithm to the coverage model with an interaction level m, the resulting test plan may include all valid value tuples of size m.

In one implementation, in addition or instead of applying a combinatorial algorithm to the model for the system under test, any other algorithm that can randomly or otherwise select variable value combinations from the model may be used to generate a test suite for the system under test. Further, a so called hole analysis may be applied to the model to determine uncovered variable value combinations in a test suite for the system under test. Without limitation, in some embodiments, an algorithm may be applied to the model to select tests, out of a given set of tests, to be included in a test suite for the system under test. All the above applications may help enhance the coverage of the implemented test suite for the system under test.

It is noteworthy that the above disclosed scenarios, methods, implementations and embodiments are provided by way of example. Thus, depending on implementation, optional value combinations and functions may be utilized to address alternative objectives in configuring a test space. As such, the above examples, embodiments and implementations should not be construed as limiting the scope of the claimed subject matter to the disclosed example scenarios or details.

In different embodiments, the claimed subject matter may be implemented as a combination of both hardware and software elements, or alternatively either entirely in the form of hardware or entirely in the form of software. Further, computing systems and program software disclosed herein may comprise a controlled computing environment that may be presented in terms of hardware components or logic code executed to perform methods and processes that achieve the results contemplated herein. Said methods and processes, when performed by a general purpose computing system or machine, convert the general purpose machine to a specific purpose machine.

Figure 3A:
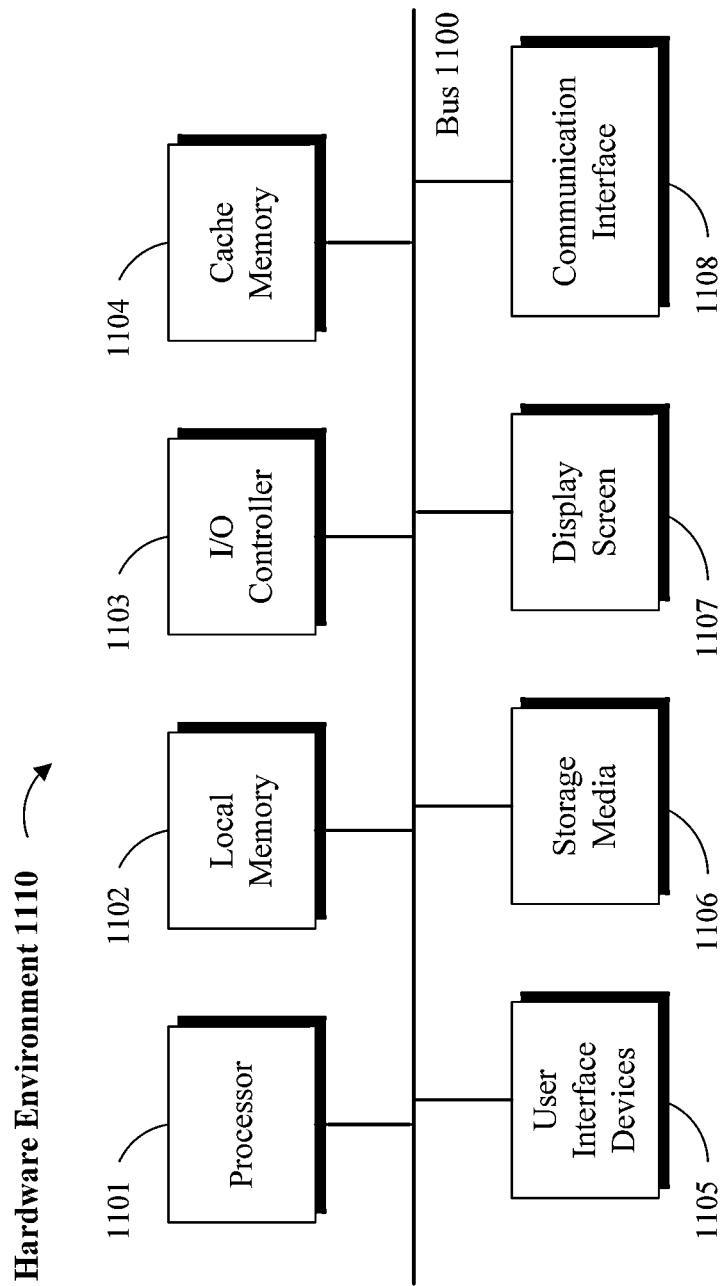
FIGS. 3A and 3B are block diagrams of hardware and software environments in which the disclosed systems and methods may operate, in accordance with one or more embodiments.
Figure 3B:
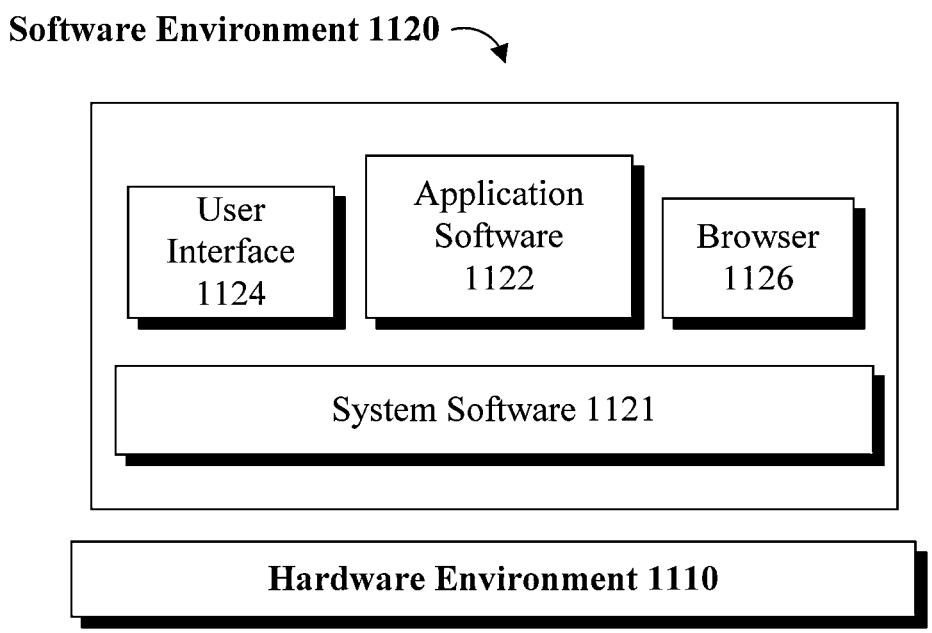

Referring to FIGS. 3A and 3B, a computing system environment in accordance with an exemplary embodiment may be composed of a hardware environment 1110 and a software environment 1120. The hardware environment 1110 may comprise logic units, circuits or other machinery and equipments that provide an execution environment for the components of software environment 1120. In turn, the software environment 1120 may provide the execution instructions, including the underlying operational settings and configurations, for the various components of hardware environment 1110.

Referring to FIG. 3A, the application software and logic code disclosed herein may be implemented in the form of computer readable code executed over one or more computing systems represented by the exemplary hardware environment 1110. As illustrated, hardware environment 110 may comprise a processor 1101 coupled to one or more storage elements by way of a system bus 1100. The storage elements, for example, may comprise local memory 1102, storage media 1106, cache memory 1104 or other computer-usable or computer readable media. Within the context of this disclosure, a computer usable or computer readable storage medium may include any recordable article that may be utilized to contain, store, communicate, propagate or transport program code.

A computer readable storage medium may be an electronic, magnetic, optical, electromagnetic, infrared, or semiconductor medium, system, apparatus or device. The computer readable storage medium may also be implemented in a propagation medium, without limitation, to the extent that such implementation is deemed statutory subject matter. Examples of a computer readable storage medium may include a semiconductor or solid-state memory, magnetic tape, a removable computer diskette, a random access memory (RAM), a read-only memory (ROM), a rigid magnetic disk, an optical disk, or a carrier wave, where appropriate. Current examples of optical disks include compact disk, read only memory (CD-ROM), compact disk read/write (CD-R/W), digital video disk (DVD), high definition video disk (HD-DVD) or Blue-ray™ disk.

In one embodiment, processor 1101 loads executable code from storage media 1106 to local memory 1102. Cache memory 1104 optimizes processing time by providing temporary storage that helps reduce the number of times code is loaded for execution. One or more user interface devices 1105 (e.g., keyboard, pointing device, etc.) and a display screen 1107 may be coupled to the other elements in the hardware environment 1110 either directly or through an intervening I/O controller 1103, for example. A communication interface unit 1108, such as a network adapter, may be provided to enable the hardware environment 1110 to communicate with local or remotely located computing systems, printers and storage devices via intervening private or public networks (e.g., the Internet). Wired or wireless modems and Ethernet cards are a few of the exemplary types of network adapters.

It is noteworthy that hardware environment 1110, in certain implementations, may not include some or all the above components, or may comprise additional components to provide supplemental functionality or utility. Depending on the contemplated use and configuration, hardware environment 1110 may be a desktop or a laptop computer, or other computing device optionally embodied in an embedded system such as a set-top box, a personal digital assistant (PDA), a personal media player, a mobile communication unit (e.g., a wireless phone), or other similar hardware platforms that have information processing or data storage capabilities.

In some embodiments, communication interface 1108 acts as a data communication port to provide means of communication with one or more computing systems by sending and receiving digital, electrical, electromagnetic or optical signals that carry analog or digital data streams representing various types of information, including program code. The communication may be established by way of a local or a remote network, or alternatively by way of transmission over the air or other medium, including without limitation propagation over a carrier wave.

As provided here, the disclosed software elements that are executed on the illustrated hardware elements are defined according to logical or functional relationships that are exemplary in nature. It should be noted, however, that the respective methods that are implemented by way of said exemplary software elements may be also encoded in said hardware elements by way of configured and programmed processors, application specific integrated circuits (ASICs), field programmable gate arrays (FPGAs) and digital signal processors (DSPs), for example.

Referring to FIG. 3B, software environment 1120 may be generally divided into two classes comprising system software 1121 and application software 1122 as executed on one or more hardware environments 1110. In one embodiment, the methods and processes disclosed here may be implemented as system software 1121, application software 1122, or a combination thereof. System software 1121 may comprise control programs, such as an operating system (OS) or an information management system, that instruct one or more processors 1101 (e.g., microcontrollers) in the hardware environment 1110 on how to function and process information. Application software 1122 may comprise but is not limited to program code, data structures, firmware, resident software, microcode or any other form of information or routine that may be read, analyzed or executed by a processor 1101.

In other words, application software 1122 may be implemented as program code embedded in a computer program product in form of a computer-usable or computer readable storage medium that provides program code for use by, or in connection with, a computer or any instruction execution system. Moreover, application software 1122 may comprise one or more computer programs that are executed on top of system software 1121 after being loaded from storage media 1106 into local memory 1102. In a client-server architecture, application software 1122 may comprise client software and server software. For example, in one embodiment, client software may be executed on a client computing system that is distinct and separable from a server computing system on which server software is executed.

Software environment 1120 may also comprise browser software 1126 for accessing data available over local or remote computing networks. Further, software environment 1120 may comprise a user interface 1124 (e.g., a graphical user interface (GUI)) for receiving user commands and data. It is worthy to repeat that the hardware and software architectures and environments described above are for purposes of example. As such, one or more embodiments may be implemented over any type of system architecture, functional or logical platform or processing environment.

It should also be understood that the logic code, programs, modules, processes, methods and the order in which the respective processes of each method are performed are purely exemplary. Depending on implementation, the processes or any underlying sub-processes and methods may be performed in any order or concurrently, unless indicated otherwise in the present disclosure. Further, unless stated otherwise with specificity, the definition of logic code within the context of this disclosure is not related or limited to any particular programming language, and may comprise one or more modules that may be executed on one or more processors in distributed, non-distributed, single or multiprocessing environments.

As will be appreciated by one skilled in the art, a software embodiment may include firmware, resident software, microcode, etc. Certain components including software or hardware or combining software and hardware aspects may generally be referred to herein as a "circuit," "module" or "system." Furthermore, the subject matter disclosed may be implemented as a computer program product embodied in one or more computer readable storage medium(s) having computer readable program code embodied thereon. Any combination of one or more computer readable storage medium(s) may be utilized. The computer readable storage medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing.

In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable storage medium may be transmitted using any appropriate medium, including but not limited to wireless, wireline, optical fiber cable, RF, etc., or any suitable combination of the foregoing. Computer program code for carrying out the disclosed operations may be written in any combination of one or more programming languages, including an object oriented programming language such as Java, Smalltalk, C++ or the like and conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Certain embodiments are disclosed with reference to flowchart illustrations and/or block diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The claimed subject matter has been provided here with reference to one or more features or embodiments. Those skilled in the art will recognize and appreciate that, despite of the detailed nature of the exemplary embodiments provided here, changes and modifications may be applied to said embodiments without limiting or departing from the generally intended scope. These and various other adaptations and combinations of the embodiments provided here are within the scope of the disclosed subject matter as defined by the claims and their full set of equivalents.

What is claimed is:

1. A method executable on one or more processors for modeling a test space for verifying a behavior of a computing system, the method comprising:
    defining a coverage model associated with verifying the computing system, wherein the defined coverage model includes a set of variables, further comprising:
    one or more variables within at least one subset of a plurality of subsets of the set of variables are selected according to an interaction level requirement defined for at least one or more of the subsets, wherein the interaction level corresponds to a coverage of the test space that covers a plurality of possible combinations of the one or more variables at multiple levels, wherein respective values for the one or more selected variables within the subset of the set of variables are assigned, and
    one or more definitions for value combinations for said variables with assigned values,
    wherein at least one of said value combinations is defined as optional, and zero or more value combinations are defined as forbidden or mandatory for purpose of generating test scenarios to test a system for which the coverage model is defined, wherein the at least one of said value combinations defined as optional can increase the coverage of the test space, and wherein the at least one of the value combinations are defined as optional and the zero or more value combinations are defined as forbidden or mandatory by a pre-defined list of logical Boolean operations or indicators, wherein the pre-defined list of logical operations or indicators comprises a plurality of binary flags associated with a logical computing language; and
    generating a plurality of test scenarios to test the computing system for which the coverage model is defined.

2. The method of claim 1 further comprising generating a set of test scenarios such that every value combination defined as mandatory is included in at least one test scenario, and none of the value combinations defined as forbidden is included in any test scenario.

3. The method of claim 1 further comprising generating a set of test scenarios such that one or more of said value combinations defined as mandatory are included in at least one test scenario, and none of the value combinations defined as forbidden is included in any test scenario.

4. The method of claim 1 further comprising generating a graphical user interface for allowing a user to select one or more of said value combinations as optional.

5. The method of claim 4 wherein the selecting is performed by way of a user interactively marking a value combination displayed in a row of a table that graphically represented said value combinations.

6. The method of claim 4 wherein the selecting is performed by entering an expression in a syntax that indicates a value combination is optional.

7. The method of claim 4 wherein the selecting is performed by a user interactively checking a box associated with a value combination displayed in graphical user interface.

8. The method of claim 5 wherein the marking comprises selecting the row in which the value combination is displayed by way of a user interface mechanism.

9. The method of claim 8 wherein the marking further comprises committing the selected row by way of activating an action button.

10. The method of claim 4 wherein the selecting is performed by way of a user interacting with the graphical user interface to build a logical expression that defines one or more of said value combinations that is to be selected.

11. The method of claim 1 wherein an algorithm is applied to the model to generate a test suite for the system under test.

12. The method of claim 1 wherein a hole analysis is applied to the model to determine uncovered variable value combinations in a test suite for the system under test.

13. The method of claim 1 wherein an algorithm is applied to the model to select one or more tests, out of a given set of tests, to be included in a test suite for the system under test.

14. The method of claim 1 wherein an algorithm is applied to the model to enhance a test suite for the system under test.

15. The method of claim 11 wherein the algorithm is a combinatorial algorithm.

16. A system comprising one or more processors for executing a method for modeling a test space for verifying a behavior of a computing system, the system further comprising:
- a logic unit for defining a coverage model associated with verifying the computing system, wherein the defined coverage model includes a set of variables, further comprising:
- one or more variables within at least one subset of a plurality of subsets of the set of variables are selected according to an interaction level requirement defined for at least one or more of the subsets, wherein the interaction level corresponds to a coverage of the test space that covers a plurality of possible combinations of the one or more variables at multiple levels, wherein respective values for the one or more selected variables within the subset of the set of variables are assigned, and
- one or more definitions for value combinations for said variables with assigned values,
- wherein at least one of said value combinations is defined as optional, and zero or more value combinations are defined as forbidden or mandatory for purpose of generating test scenarios to test a system for which the coverage model is defined, wherein the at least one of said value combinations defined as optional can increase the coverage of the test space, and wherein the at least one of the value combinations are defined as optional and the zero or more value combinations are defined as forbidden or mandatory by a pre-defined list of logical Boolean operations or indicators, wherein the pre-defined list of logical operations or indicators comprises a plurality of binary flags associated with a logical computing language; and
- generating a plurality of test scenarios to test the computing system for which the coverage model is defined.

17. The system of claim 16 further comprising a logic unit for generating a set of test scenarios such that every value combination defined as mandatory is included in at least one test scenario, and none of the value combinations defined as forbidden is included in any test scenario.

18. The system of claim 16 further comprising a logic unit for generating a set of test scenarios such that one or more of said value combinations defined as mandatory are included in at least one test scenario, and none of the value combinations defined as forbidden is included in any test scenario.

19. The system of claim 16 further comprising a logic unit for generating a graphical user interface for allowing a user to select one or more of said value combinations as optional.

20. The system of claim 19 wherein the selecting is performed by way of a user interactively marking a value combination displayed in a row of a table that graphically represented said value combinations.

21. A computer program product comprising program code embedded in a non-transitory data storage medium, wherein execution of the program code on a computer causes the computer to:
- define a coverage model associated with verifying a computing system, wherein the defined coverage model includes a set of variables, further comprising:
- one or more variables within at least one subset of a plurality of subsets of the set of variables are selected according to an interaction level requirement defined for at least one or more of the subsets, wherein the interaction level corresponds to a coverage of the test space that covers a plurality of possible combinations of the one or more variables at multiple levels, wherein respective values for the one or more selected variables within the subset of the set of variables are assigned, and
- one or more variables, wherein respective values for the variables are assigned according to an interaction level requirement corresponding to a coverage of the test space that covers a plurality of possible combinations of the one or more variables at multiple levels, and
- one or more definitions for value combinations for said variables with assigned values,
- wherein at least one of said value combinations is defined as optional, and zero or more value combinations are defined as forbidden or mandatory for purpose of generating test scenarios to test a system for which the coverage model is defined, wherein the at least one of said value combinations defined as optional can increase the coverage of the test space, and wherein the at least one of the value combinations are defined as optional and the zero or more value combinations are defined as forbidden or mandatory by a pre-defined list of logical Boolean operations or indicators, wherein the pre-defined list of logical operations or indicators comprises a plurality of binary flags associated with a logical computing language; and
- generating a plurality of test scenarios to test the computing system for which the coverage model is defined.

22. The computer program product of claim 21 wherein execution of the program code on the computer further causes the computer to generate a set of test scenarios such that every value combination defined as mandatory is included in at least one test scenario, and none of the value combinations defined as forbidden is included in any test scenario.

23. The computer program product of claim 21 wherein execution of the program code on the computer further causes the computer to generate a set of test scenarios such that one or more of said value combinations defined as mandatory are included in at least one test scenario, and none of the value combinations defined as forbidden is included in any test scenario.

24. The computer program product of claim 21 wherein execution of the program code on the computer further causes the computer to generate a graphical user interface for allowing a user to select one or more of said value combinations as optional.

25. The computer program product of claim 24 wherein the selecting is performed by way of a user interactively marking a value combination displayed in a row of a table that graphically represented said value combinations.

* * * * *